United States Patent
Ge et al.

(10) Patent No.: US 12,055,613 B2
(45) Date of Patent: Aug. 6, 2024

(54) MAGNETIC RESONANCE IMAGING SYSTEM AND POSITIONING METHOD OF IMPLANT THEREFOR

(71) Applicant: GE Precision Healthcare LLC, Wauwatosa, WI (US)

(72) Inventors: Yaan Ge, Beijing (CN); Kun Wang, Beijing (CN); Fan Yang, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 360 days.

(21) Appl. No.: 17/304,292

(22) Filed: Jun. 17, 2021

(65) Prior Publication Data
US 2021/0396828 A1    Dec. 23, 2021

(30) Foreign Application Priority Data
Jun. 22, 2020  (CN) .......................... 202010573616.3

(51) Int. Cl.
*G01R 33/561* (2006.01)
*G01R 33/48* (2006.01)
(Continued)

(52) U.S. Cl.
CPC ..... *G01R 33/5618* (2013.01); *G01R 33/4818* (2013.01); *G01R 33/543* (2013.01);
(Continued)

(58) Field of Classification Search
CPC ............ G01R 33/5618; G01R 33/4818; G01R 33/543; G06T 7/168; G06T 2207/10088; G06T 2207/30052
See application file for complete search history.

(56) References Cited

U.S. PATENT DOCUMENTS 11,209,506 B2 * 12/2021 Yang ................. G01R 33/4804
2005/0030025 A1 * 2/2005 Ma ...................... G01R 33/485
324/309
(Continued)

FOREIGN PATENT DOCUMENTS

CN          108303746 A       7/2018

OTHER PUBLICATIONS

Hargreaves et al., "2D multi-spectral imaging for fast MRI near metal." Magnetic Resonance in Medicine. Feb. 2018;79(2):968-73, 14 pages.
(Continued)

*Primary Examiner* — Dixomara Vargas

(57) ABSTRACT

Provided in the present application are a magnetic resonance imaging system, a positioning method of an implant therefor, and a non-transitory computer-readable storage medium. The positioning method of the implant for the magnetic resonance imaging system includes: executing a first scanning sequence to obtain original image data and reconstructing an edge image of the implant on the basis of the original image data. The first scanning sequence includes: a radio frequency excitation pulse and a first layer selection gradient pulse corresponding to the radio frequency excitation pulse, the frequency of the radio frequency excitation pulse having a preset offset relative to a center frequency; and a radio frequency refocusing pulse and a second layer selection gradient pulse corresponding to the radio frequency refocusing pulse, the direction of the second layer selection gradient pulse being opposite to the direction of the first layer selection gradient pulse.

15 Claims, 11 Drawing Sheets

(51) Int. Cl.
　　*G01R 33/54* (2006.01)
　　*G06T 7/168* (2017.01)

(52) U.S. Cl.
　　CPC .... *G06T 7/168* (2017.01); *G06T 2207/10088* (2013.01); *G06T 2207/30052* (2013.01)

(56) References Cited

U.S. PATENT DOCUMENTS

| | | | | |
|---|---|---|---|---|
| 2007/0229070 | A1* | 10/2007 | Miyazaki | G01N 24/08 |
| | | | | 324/307 |
| 2010/0121179 | A1* | 5/2010 | Min | G01R 33/583 |
| | | | | 600/421 |
| 2013/0249548 | A1* | 9/2013 | Stemmer | G01R 33/44 |
| | | | | 324/309 |
| 2014/0300357 | A1* | 10/2014 | Bachschmidt | G01R 33/56536 |
| | | | | 324/309 |
| 2015/0268322 | A1* | 9/2015 | Paul | G01R 33/34 |
| | | | | 324/309 |
| 2015/0285890 | A1* | 10/2015 | Bachschmidt | G01R 33/56536 |
| | | | | 324/309 |
| 2016/0033603 | A1* | 2/2016 | Paul | G01R 33/482 |
| | | | | 324/309 |
| 2017/0356973 | A1* | 12/2017 | Wheaton | G01R 33/3854 |
| 2019/0150781 | A1* | 5/2019 | Koch | A61B 5/7267 |
| 2020/0110144 | A1* | 4/2020 | Frydman | G01R 33/561 |
| 2021/0041514 | A1* | 2/2021 | Yang | G01R 33/4804 |

OTHER PUBLICATIONS

Lüdeke et al., "Susceptibility artefacts in NMR imaging." Magnetic Resonance Imaging. Jan. 1, 1985;3(4):329-43, 15 pages.

* cited by examiner

MAGNETIC RESONANCE IMAGING SYSTEM AND POSITIONING METHOD OF IMPLANT THEREFOR

CROSS-REFERENCE TO RELATED APPLICATIONS

This application claims priority pursuant to 35 U.S.C. 119(a) to China Patent Application No. 202010573616.3 filed on Jun. 22, 2020, the disclosure of which is herein incorporated by reference in its entirety.

TECHNICAL FIELD

The present invention relates to a medical imaging technology, and more specifically, to a positioning method of an implant for a magnetic resonance imaging system, a display method, a magnetic resonance imaging system, and a non-transitory computer-readable storage medium.

BACKGROUND

Magnetic resonance imaging (MRI), as a medical imaging modality, can obtain images of the human body without using X-rays or other ionizing radiation. MRI uses a magnet having a strong magnetic field to generate a main magnetic field B0. If a part to be imaged of the human body is positioned in the main magnetic field B0, nuclear spin associated with hydrogen nuclei in human tissue is polarized, so that the tissue of the part to be imaged generates a longitudinal magnetization vector at a macroscopic level. After a radio-frequency field B1 intersecting the direction of the main magnetic field B0 is applied, the direction of rotation of protons changes so that the tissue of the part to be imaged generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the part to be imaged can be reconstructed based on the acquired signal. A gradient system is configured to transmit a layer selection gradient pulse, a phase-coded gradient pulse, and a frequency-coded gradient pulse (also referred to as a read-out gradient pulse) to provide three-dimensional position information for the aforementioned magnetic resonance signal to implement image reconstruction.

In recent years, people increasingly tend to have equipment such as medical equipment, orthopedic equipment, plastic equipment, and the like implanted in the body. For an implant such as a pacemaker, orthopedic implant equipment, a puncture device, and the like in the human body, before scanning, it is usually necessary to obtain parameters relevant to the implant by means of oral inquiry or medical record search, and the parameters include, for example, the model number, the size, the position, and the like of the implant. However, for a subject under examination in coma or an unconscious subject under examination, the relevant parameters of the implant cannot be obtained by the aforementioned manners. In the case in which it is impossible to learn whether an implant exists in the subject under examination and the position of the implant, certain effects or difficulties are brought to magnetic resonance imaging scanning.

During magnetic resonance imaging scanning, existence of an implant causes a non-uniform main magnetic field, thereby resulting in problem of missing part of a final image. However, since part of tissue of the human body contains air, and since existence of an air void may also result in problem of missing part of a magnetic resonance image, the image cannot be used to determine whether an implant exists in the subject under examination.

SUMMARY

Provided in the present invention are a positioning method of an implant for a magnetic resonance imaging system, a display method, a magnetic resonance imaging system, and a non-transitory computer-readable storage medium.

Provided in an exemplary embodiment of the present invention is a positioning method of an implant for a magnetic resonance imaging system, comprising: executing a first scanning sequence to obtain original image data and reconstructing an edge image of the implant on the basis of the original image data, wherein the first scanning sequence comprises: a radio frequency excitation pulse and a first layer selection gradient pulse corresponding to the radio frequency excitation pulse, and a radio frequency refocusing pulse and a second layer selection gradient pulse corresponding to the radio frequency refocusing pulse, wherein the frequency of the radio frequency excitation pulse has a preset offset relative to a center frequency, and the direction of the second layer selection gradient pulse is opposite to the direction of the first layer selection gradient pulse.

Specifically, the radio frequency excitation pulse is configured to excite marginal tissue of the implant.

Specifically, the preset offset is determined on the basis of relevant parameters of the implant.

Specifically, the reconstructing an edge image of the implant comprises reconstructing the original image data on the basis of a coil sensitivity map, wherein the original image data comprises data received by a plurality of radio frequency receive channels.

Specifically, the positioning method further comprises determining, on the basis of a difference between one-dimensional signals or images obtained by a second scanning sequence and a third scanning sequence, whether a subject under examination comprises an implant, wherein a frequency-encoding direction of the second scanning sequence is different from a frequency-encoding direction of the third scanning sequence.

Specifically, the determining whether a subject under examination comprises an implant comprises: executing the second scanning sequence to obtain a first image or a first group of one-dimensional signals of the subject under examination, the second scanning sequence comprising a first frequency-encoding direction; executing the third scanning sequence to obtain a second image or a second group of one-dimensional signals of the subject under examination, the third scanning sequence comprising a second frequency-encoding direction, and the second frequency-encoding direction being perpendicular to the first frequency-encoding direction; and determining, on the basis of a difference between the first image and the second image or a difference between the first group of one-dimensional signals and the second group of one-dimensional signals, whether the subject under examination comprises an implant.

Specifically, the obtaining a first group of one-dimensional signals of the subject under examination comprises: scanning the subject under examination in the first frequency-encoding direction, and storing an obtained first group of image data in a K space; selecting, from the K space, a row of or a column of image data corresponding to a specific frequency; and performing a Fourier transform on the row of or the column of image data to obtain the first group of one-dimensional signals.

Specifically, the obtaining a second group of one-dimensional signals of the subject under examination comprises: determining a specific phase, the specific phase and the specific frequency corresponding to the same row or the same column in the K space; scanning the subject under examination in the second frequency-encoding direction and the specific phase to obtain image data of the same row or the same column as a second group of image data; and performing a Fourier transform on the second image data to obtain the second group of one-dimensional signals.

Specifically, the determining, on the basis of a difference between the first image and the second image or a difference between the first group of one-dimensional signals and the second group of one-dimensional signals, whether the subject under examination comprises an implant comprises: if the difference between the first image and the second image exceeds a preset threshold, or if the difference between the first group of one-dimensional signals and the second group of one-dimensional signals exceeds a preset threshold, determining that the subject under examination comprises an implant.

Specifically, the positioning placement further comprises: after completion of imaging scanning, indicating predicted values of magnetic resonance imaging system parameters relevant to the implant and a safety status of one or a plurality of the parameters.

Further provided in an exemplary embodiment of the present invention is a non-transitory computer-readable storage medium, configured to store a computer program, and when executed by a computer, the computer program causing the computer to perform instructions of the aforementioned positioning method of an implant for a magnetic resonance imaging system.

Further provided in an exemplary embodiment of the present invention is a display method, comprising a first option related to detection by determination of the position of an implant, the first option being configured to: execute a first scanning sequence to obtain original image data and reconstruct an edge image of the implant on the basis of the original image data, wherein the first scanning sequence comprises: a radio frequency excitation pulse and a first layer selection gradient pulse corresponding to the radio frequency excitation pulse, and a radio frequency refocusing pulse and a second layer selection gradient pulse corresponding to the radio frequency refocusing pulse, wherein the frequency of the radio frequency excitation pulse has a preset offset relative to a center frequency, and the direction of the second layer selection gradient pulse is opposite to the direction of the first layer selection gradient pulse.

Specifically, the display method further comprises a second option related to detection of existence of an implant, the second option being configured to: execute the second scanning sequence to obtain a first image or a first group of one-dimensional signals of the subject under examination, the second scanning sequence comprising a first frequency-encoding direction; execute the third scanning sequence to obtain a second image or a second group of one-dimensional signals of the subject under examination, the third scanning sequence comprising a second frequency-encoding direction, and the second frequency-encoding direction being perpendicular to the first frequency-encoding direction; and determine, on the basis of a difference between the first image and the second image or a difference between the first group of one-dimensional signals and the second group of one-dimensional signals, whether the subject under examination comprises an implant.

Further provided in an exemplary embodiment of the present invention is a magnetic resonance imaging system, comprising a positioning device of an implant, the positioning device of the implant comprising a control module and a reconstruction module, wherein the control module is configured to execute a first scanning sequence to obtain original image data, wherein the first scanning sequence comprises: a radio frequency excitation pulse and a first layer selection gradient pulse corresponding to the radio frequency excitation pulse, and a radio frequency refocusing pulse and a second layer selection gradient pulse corresponding to the radio frequency refocusing pulse, wherein the frequency of the radio frequency excitation pulse has a preset offset relative to a center frequency, and the direction of the second layer selection gradient pulse is opposite to the direction of the first layer selection gradient pulse; and the reconstruction module is configured to reconstruct an edge image of the implant on the basis of the original image data.

Specifically, the radio frequency excitation pulse is configured to excite marginal tissue of the implant.

Specifically, the preset offset is determined on the basis of relevant parameters of the implant.

Specifically, the reconstruction module is further configured to reconstruct the original image data on the basis of a coil sensitivity map, wherein the original image data comprises data received by a plurality of radio frequency receive channels.

Specifically, the system further comprises a determination module, configured to determine, on the basis of a difference between one-dimensional signals or images obtained by a second scanning sequence and a third scanning sequence, whether a subject under examination comprises an implant, wherein a frequency-encoding direction of the second scanning sequence is different from a frequency-encoding direction of the third scanning sequence.

Specifically, the determination module comprises a first unit, a second unit, and a third unit, wherein the first unit is configured to execute the second scanning sequence to obtain a first image or a first group of one-dimensional signals of the subject under examination, the second scanning sequence comprising a first frequency-encoding direction; a second unit is configured to execute the third scanning sequence to obtain a second image or a second group of one-dimensional signals of the subject under examination, the third scanning sequence comprising a second frequency-encoding direction, and the second frequency-encoding direction being perpendicular to the first frequency-encoding direction; the third unit is configured to determine, on the basis of a difference between the first image and the second image or a difference between the first group of one-dimensional signals and the second group of one-dimensional signals, whether the subject under examination comprises an implant.

Specifically, the system further comprises an indication module, configured to, after completion of imaging scanning, indicate predicted values of magnetic resonance imaging system parameters relevant to the implant and a safety status of one or a plurality of the parameters.

Other features and aspects will become clear through the following detailed description, accompanying drawings, and claims.

BRIEF DESCRIPTION OF THE DRAWINGS

The present invention may be better understood by describing exemplary embodiments of the present invention with reference to accompanying drawings, in which.

DETAILED DESCRIPTION OF THE EMBODIMENTS

Specific implementations of the present invention will be described in the following. It should be noted that during the specific description of the implementations, it is impossible to describe all features of the actual implementations in detail in this description for the sake of brief description. It should be understood that in the actual implementation of any of the implementations, as in the process of any engineering project or design project, a variety of specific decisions are often made in order to achieve the developer's specific objectives and meet system-related or business-related restrictions, which will vary from one implementation to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. The terms "first," "second," and similar terms used in the description and claims of the patent application of the present invention do not denote any order, quantity, or importance, but are merely intended to distinguish between different constituents. "One," "a(n)," and similar terms are not meant to be limiting, but rather denote the presence of at least one. The term "include," "comprise," or a similar term is intended to mean that an element or article that appears before "include" or "comprise" encompasses an element or article and equivalent elements that are listed after "include" or "comprise," and does not exclude other elements or articles. The term "connect," "connected," or a similar term is not limited to a physical or mechanical connection, and is not limited to a direct or indirect connection.

Figure 1:
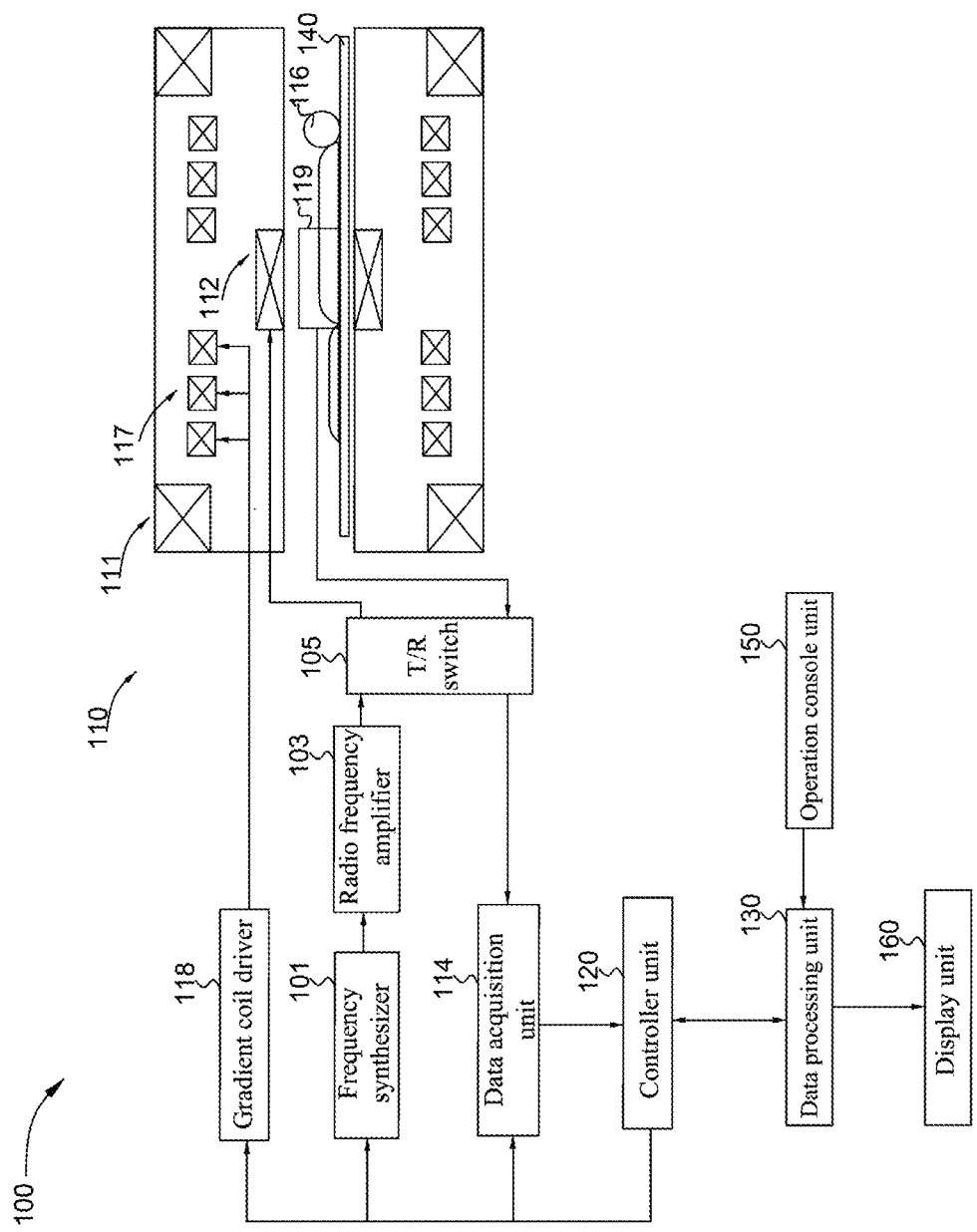
FIG. 1 is a schematic diagram of a magnetic resonance imaging system according to some embodiments of the present invention.

FIG. 1 shows a schematic diagram of an MRI system 100 according to some embodiments of the present invention. As shown in FIG. 1, the MRI system 100 includes a scanner 110, a controller unit 120, and a data processing unit 130. The MRI system 100 is described only as an example. In other embodiments, the MRI system 100 may have various variations, as long as image data can be acquired from a subject under examination.

The scanner 110 may be configured to obtain data of a subject 116 under examination. The controller unit 120 is coupled to the scanner 110 to control the operation of the scanner 110. The scanner 110 may include a main magnet 111, a radio frequency transmit coil 112, a frequency synthesizer 101, a radio frequency amplifier 103, a transmit/receive switch (T/R switch) 105, a gradient coil system 117, a gradient coil driver 118, and a radio frequency receive coil 119.

The main magnet 111 generally includes, for example, an annular superconducting magnet. The annular superconducting magnet is mounted in an annular vacuum container. The annular superconducting magnet defines a cylindrical space surrounding the subject 116 under examination. A constant main magnetic field such as a main magnetic field B0 is generated in a Z direction of the cylindrical space. The MRI system 100 uses the generated main magnetic field B0 to emit a magnetostatic pulse signal to the subject 116 under examination placed in an imaging space, so that precession of protons in the body of the subject 116 under examination is ordered to generate a longitudinal magnetization vector.

The frequency synthesizer 101 is configured to generate a radio frequency pulse. The radio frequency pulse may include a radio frequency excitation pulse. The radio frequency excitation pulse is amplified by the radio frequency amplifier 103 and is then applied to the radio frequency transmit coil 112 by the T/R switch 105, so that the radio frequency transmit coil 112 emits to the subject 116 under examination a radio frequency magnetic field B1 orthogonal to the main magnetic field B0 so as to excite nuclei in the body of the subject 116 under examination, and the longitudinal magnetization vector is converted into a transverse magnetization vector. After the end of the radio frequency excitation pulse, a free induction decay signal, i.e., a magnetic resonance signal that can be acquired, is generated in the process in which the transverse magnetization vector of the subject 116 under examination gradually returns to zero.

The radio frequency transmit coil 112 may be a body coil, wherein the body coil may be connected to the T/R switch 105. Through control of the T/R switch, the body coil can be switched between a transmit mode and a receive mode. In the receive mode, the body coil may be configured to receive a magnetic resonance signal from the subject 116 under examination. In addition, the radio frequency transmit coil 112 may also be a local coil, such as a head coil.

In some embodiments, the radio frequency transmit coil is not limited to the body coil and local coil mentioned in the present application, and may also include other appropriate types of appropriate coils. The radio frequency receive coil is also not limited to the body coil, local coil, and surface coil mentioned in the present application, and may also include other appropriate types of coils.

The gradient coil system 117 forms a magnetic field gradient in the imaging space so as to provide three-dimensional position information for the magnetic resonance signal described above. The magnetic resonance signal may be received by the radio frequency receive coil 119, or by the body coil or the local coil in the receive mode. The data processing unit 130 may process the received magnetic resonance signal so as to obtain required images or image data.

Specifically, the gradient coil system 117 may include three gradient coils. Each of the three gradient coils generates a gradient magnetic field inclined to one of three spatial axes (for example, X-axis, Y-axis, and Z-axis) perpendicular to one another, and generates a gradient field according to imaging conditions in each of a slice selection direction, a phase-encoding direction, and a frequency-encoding direction. More specifically, the gradient coil system 117 applies a gradient field in the slice selection direction of the subject 116 under examination so as to select a slice. The radio frequency transmit coil 112 emits a radio frequency excitation pulse to the slice selected for the subject 116 under examination and excites the slice. The gradient coil system 117 also applies a gradient field in the phase-encoding direction of the subject 116 under examination so as to perform phase encoding on a magnetic resonance signal of the excited slice. The gradient coil system 117 then applies a gradient field in the frequency-encoding direction of the subject 116 under examination so as to perform frequency encoding on the magnetic resonance signal of the excited slice.

The gradient coil driver 118 is configured to respectively provide a suitable power signal for the aforementioned three gradient coils in response to a sequence control signal transmitted by the controller unit 120.

The scanner 110 may further include a data acquisition unit 114. The data acquisition unit 114 is configured to acquire a magnetic resonance signal received by a radio frequency surface coil 119 or the body coil. The data acquisition unit 114 may include, for example, a radio frequency preamplifier (not shown), a phase detector (not shown), and an analog-to-digital converter (not shown), wherein the radio frequency preamplifier is configured to amplify a magnetic resonance signal received by the radio frequency surface coil 119 or the body coil. The phase detector is configured to perform phase detection on the amplified magnetic resonance signal. The analog-to-digital converter is configured to convert the magnetic resonance signal on which the phase detection has been performed from an analog signal to a digital signal. The data processing unit 130 can perform processing such as calculation and reconstruction on the digitized magnetic resonance signal so as to acquire a medical image.

The data processing unit 130 may include a computer and a storage medium. A program of predetermined data processing to be executed by the computer is recorded on the storage medium. The data processing unit 130 may be connected to the controller unit 120 and perform data processing based on a control signal received from the controller unit 120. The data processing unit 130 may also be connected to the data acquisition unit 114 to receive a magnetic resonance signal output by the data acquisition unit 114, so as to perform the aforementioned data processing.

The controller unit 120 may include a computer and a storage medium, where the storage medium is used to store a program executable by the computer, and when the computer executes the program, a plurality of components of the scanner 110 are enabled to implement operations corresponding to the aforementioned imaging sequence. The data processing unit 130 may also be caused to perform predetermined data processing.

The storage medium of the controller unit 120 and the data processing unit 130 may include, for example, a ROM, a floppy disk, a hard disk, an optical disk, a magneto-optical disk, a CD-ROM, or a non-volatile memory card.

The controller unit 120 may be set and/or arranged for use in different manners. For example, in some implementations, a single controller unit 120 may be used. In other implementations, a plurality of controller units 120 are configured to work together (for example, based on distributed processing configuration) or separately, where each controller unit 120 is configured to handle specific aspects and/or functions, and/or to process data used to generate a model used only for a specific medical imaging system 100. In some implementations, the controller unit 120 may be local (for example, in the same place as one or a plurality of medical imaging systems 100, for example, in the same facility and/or the same local network). In other implementations, the controller unit 120 may be remote and thus can only be accessed via a remote connection (for example, via the Internet or other available remote access technologies). In a specific implementation, the controller unit 120 may be configured in a manner similar to that of cloud technology, and may be accessed and/or used in a manner substantially similar to that of accessing and using other cloud-based systems.

The MRI system 100 further includes an examination table 140 on which the subject 116 under examination is placed. The subject 116 under examination may be moved into or out of the imaging space by moving the examination table 140 based on the control signal from the controller unit 120.

The MRI system 100 further includes an operation console unit 150 connected to the controller unit 120. The operation console unit 150 may send an acquired operation signal to the controller unit 120 so as to control operation states of the aforementioned components, for example, the examination table 140 and the scanner 110. The operation signal may include, for example, a scanning protocol and a parameter selected manually or automatically. The scanning protocol may include the aforementioned imaging sequence. In addition, the operation console unit 150 may transmit the obtained operation signal to the controller unit 120 to control the data processing unit 130, so as to obtain a desired image.

The operation console unit 150 may include a user input device such as a keyboard, a mouse, a voice activated controller, or any other suitable input devices, by which an operator may input an operation signal/control signal to the controller unit 120.

The MRI system 100 may further include a display unit 160 that may be connected to the operation console unit 150 to display an operation interface and may further be connected to the data processing unit 130 to display the image.

In some embodiments, the system 100 may be connected, via one or more configurable wired and/or wireless networks such as the Internet and/or a virtual private network, to one or more display units, cloud networks, printers, workstations, and/or similar devices located locally or remotely.

Figure 2:
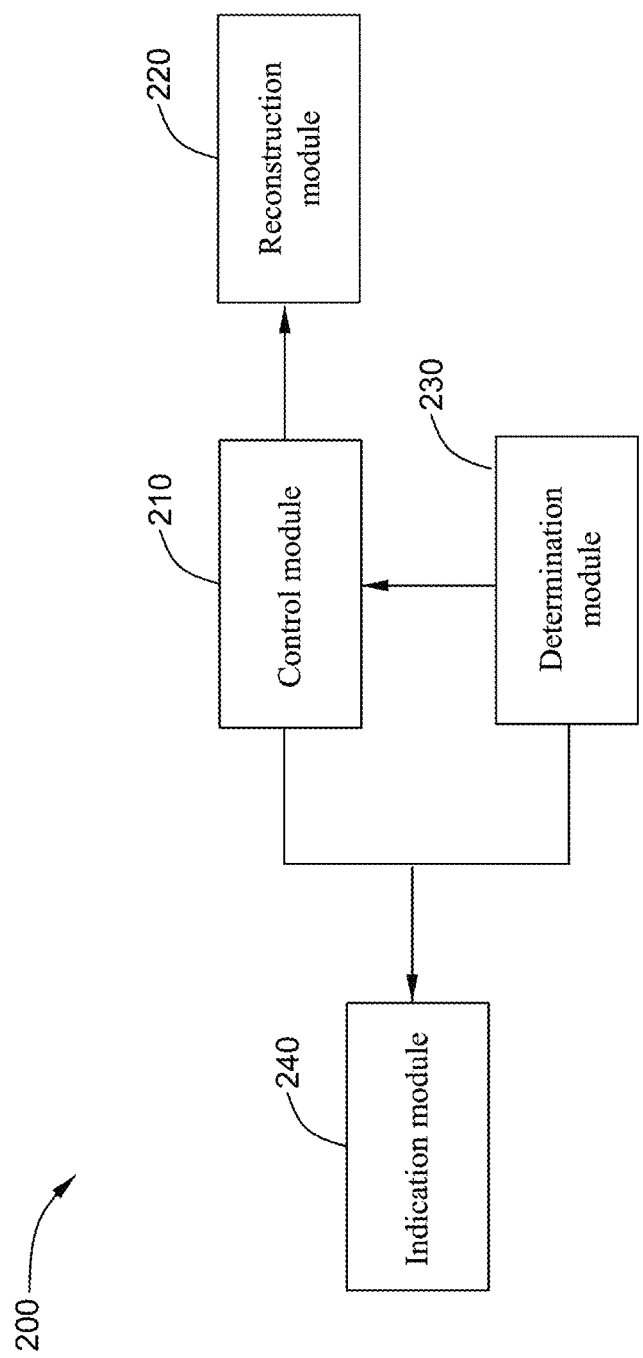
FIG. 2 is a schematic diagram of a positioning device 200 of an implant of a magnetic resonance imaging system according to some embodiments of the present invention.

FIG. 2 shows a schematic diagram of a positioning device 200 of an implant of a magnetic resonance imaging system according to some embodiments of the present invention. As shown in FIG. 2, the positioning device 200 includes a control module 210 and a reconstruction module 220.

The control module 210 is configured to execute a first scanning sequence to obtain original image data, wherein the first scanning sequence comprises: a radio frequency excitation pulse and a first layer selection gradient pulse corresponding to the radio frequency excitation pulse, and a radio frequency refocusing pulse and a second layer selection gradient pulse corresponding to the radio frequency refocusing pulse, wherein the frequency of the radio frequency excitation pulse has a preset offset relative to a center frequency, and the direction of the second layer selection gradient pulse is opposite to the direction of the first layer selection gradient pulse. In some embodiments, the control module 210 stores the obtained original image data in a K space, wherein the original image data is data of a corresponding frequency domain.

Specifically, the radio frequency excitation pulse is configured to excite marginal tissue of the implant. More specifically, the radio frequency excitation pulse including the preset offset is configured to excite the marginal tissue of the implant so as to determine an accurate position of the implant. Generally, in a 1.5 T magnetic field environment, a proton has a precession frequency of about 64 MHz, that is, the radio frequency excitation pulse has a center frequency of 64 MHz. However, the implant results in a non-uniform main magnetic field during magnetic resonance scanning, and if the main magnetic field is non-uniform, the precession frequency of the proton accordingly deviates and is no longer 64 MHz. In order to accurately excite tissue surrounding the implant, the frequency of the radio frequency excitation pulse needs to have a preset frequency offset relative to the center frequency.

In some embodiments, the preset offset is determined on the basis of relevant parameters of the implant. Specifically, the relevant parameters of the implant include at least one of a material, a size, or a type of the implant. In some embodiments, the preset offset may be obtained on the basis of a lookup table (LUT). The lookup table includes the relevant parameters of the implant and the preset offset relative to the center frequency corresponding thereto. The frequency offset may be obtained on the basis of a phantom in an experimental phase, and may be stored in the magnetic resonance imaging system. In other embodiments, the preset offset may also be manually inputted by an operator.

Figure 3:
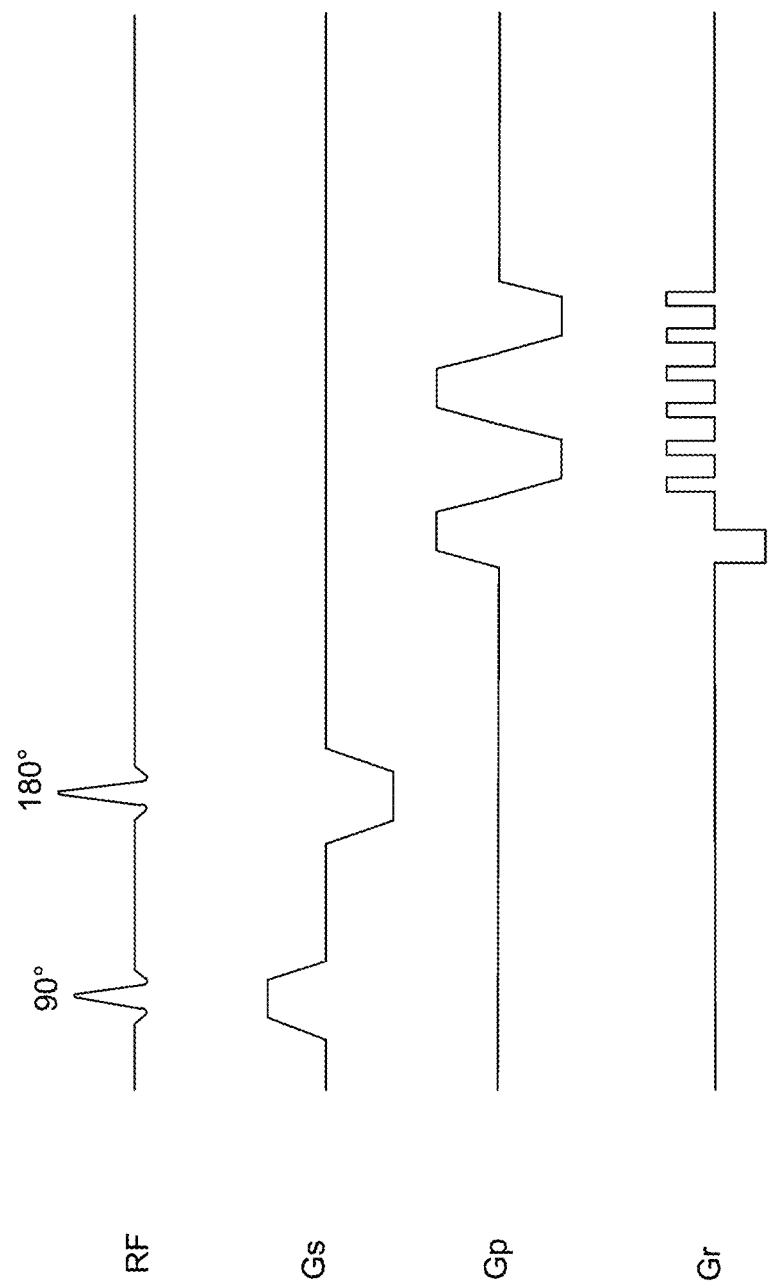
FIG. 3 is a schematic diagram of a first scanning pulse sequence.

FIG. 3 shows a schematic diagram of a first scanning pulse. As shown in FIG. 3, "RF" represents an RF pulse sequence emitted by the radio frequency transmit coil 112 in the magnetic resonance imaging system shown in FIG. 1, and the RF pulse sequence includes a 90° radio frequency excitation pulse and a 180° radio frequency refocusing pulse; "Gs" represents a pulse sequence of a layer selection gradient; "Gr" represents a pulse sequence of a phase gradient; and "Gp" represents a pulse sequence of a frequency (read-out) gradient.

Generally, after the 90° radio frequency excitation pulse is emitted, a first layer selection gradient pulse Gs is applied to the gradient coil so as to generate a layer selection gradient magnetic field. Then, after a predetermined time period of the 90° radio frequency excitation pulse, the 180° radio frequency refocusing pulse is emitted. In this case, a second layer selection gradient pulse Gs is applied to the gradient coil so as to generate a layer selection gradient magnetic field. After the 180° radio frequency refocusing pulse, the frequency gradient pulse Gp having alternating positive and negative edges is applied to the gradient coil so as to generate a frequency (read-out) gradient magnetic field, and the predetermined phase gradient pulse Gr is applied to the gradient coil so as to generate a phase gradient magnetic field.

Generally, for the layer selection gradient Gs, the direction of the second layer selection gradient pulse and the direction of the first layer selection gradient pulse are the same. In the positioning device according to some embodiments of the present invention, by reversing the direction of the second layer selection gradient pulse corresponding to the 180° radio frequency refocusing pulse, each selected layer (slice) can be separated into a separate frequency bandwidth, and a frequency bandwidth corresponding to a current selected layer is imaged separately, so that artifacts and distortion caused by the implant are reduced, and a marginal tissue image of the implant can be obtained more effectively.

It will be appreciated by those skilled in the art that FIG. 3 shows only an example of various pulse sequences, and in an actual scanning process, there are different pulse sequence forms on the basis of different scanning protocols.

Figure 4:
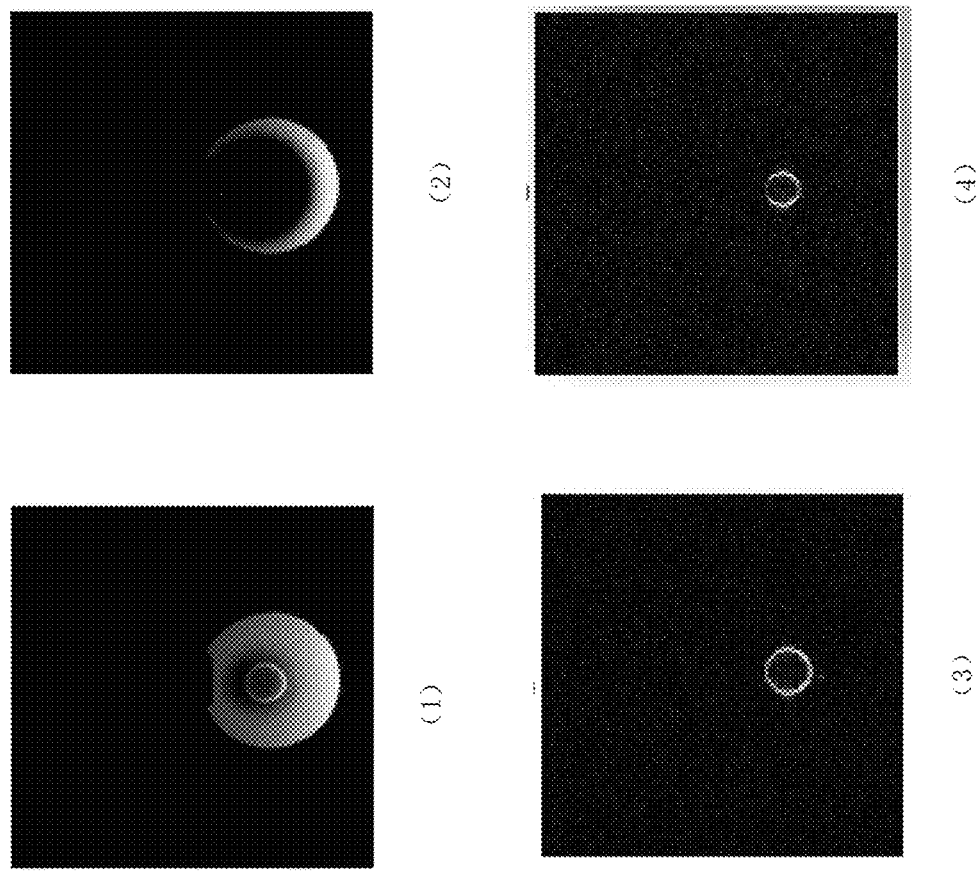
FIG. 4 is a comparison diagram of marginal tissue of an implant obtained by means of scanning performed on the basis of different first scanning pulses.

FIG. 4 shows a comparison diagram of edge images of the implant obtained by means of scanning performed on the basis of different first scanning pulses. FIG. 4(1) is an edge image of the implant obtained in a case in which the direction of the second layer selection gradient pulse and the direction of the first layer selection gradient pulse are the same and the frequency of the radio frequency excitation pulse is the center frequency. FIG. 4(2) is an edge image of the implant obtained in a case in which the direction of the second layer selection gradient pulse is opposite to the direction of the first layer selection gradient pulse and the frequency of the radio frequency excitation pulse is the center frequency. FIG. 4(3) is an edge image of the implant obtained in a case in which the direction of the second layer selection gradient pulse is opposite to the direction of the first layer selection gradient pulse and the frequency of the radio frequency excitation pulse has a 6 kHz offset relative to the center frequency. FIG. 4(4) is an edge image of the implant obtained in a case in which the direction of the second layer selection gradient pulse is opposite to the direction of the first layer selection gradient pulse and the frequency of the radio frequency excitation pulse has a 10 kHz offset relative to the center frequency.

By comparing FIG. 4(1) with FIG. 4(2), it can be learned that by reversing the direction of the second layer selection gradient pulse corresponding to the radio frequency refocusing pulse, artifacts and data loss caused by the implant can be effectively reduced. By comparing FIG. 4(2) with FIG. 4(3), it can be learned that by configuring the frequency of the radio frequency excitation pulse to have a preset offset relative to the center frequency, the marginal tissue of the implant can be effectively excited, and an accurate edge image of the implant can be obtained. By comparing FIG. 4(3) with FIG. 4(4), it can be learned that different implants, for example, implants of different types, different sizes or different materials, correspond to different preset offsets, and optimal preset offsets corresponding to implants of different parameters can be determined by means of experiments.

Please continue to refer to FIG. 2, the reconstruction module 220 is configured to reconstruct the edge image of the implant on the basis of the original image data. In some embodiments, the reconstruction module 220 performs reconstruction on the basis of the original image data stored in the K space to obtain the edge image of the implant. Specifically, the edge image of the implant can be obtained by performing a Fourier transform on the original image data stored in the K space.

In some embodiments, the radio frequency receive coil is configured to have a single channel, that is, the radio frequency receive coil includes a radio frequency receive coil unit. The original image data includes a magnetic resonance signal received and transmitted by the single channel. The reconstruction module 220 performs reconstruction on the basis of the magnetic resonance signal to obtain the edge image.

In other embodiments, the radio frequency receive coil is configured to have a plurality of channels, that is, the radio frequency receive coil includes a plurality of radio frequency receive coil units. The plurality of channels receive magnetic resonance signals respectively, and stores the magnetic resonance signals in the K space. The reconstruction module 220 performs reconstruction on the basis of the magnetic resonance signals to obtain the edge image. However, during reception of the magnetic resonance signal, each radio frequency receive coil unit has different sensitivities with respect to different parts in the imaging space; for example, the radio frequency receive coil unit is relatively sensitive to a part close to the radio frequency receive coil unit, and is less sensitive to a part located away from the radio frequency receive coil unit. If reconstruction is performed directly on the basis of the magnetic resonance signals received by the plurality of channels, then phase information in the obtained edge image may be lost, and position information of the implant may be inaccurate.

In order to avoid loss of the phase information and to obtain more accurate position information of the implant, the reconstruction module 220 is further configured to reconstruct the original image data on the basis of a coil sensitivity map, wherein the original image data includes data received by a plurality of radio frequency receive channels. Specifically, the coil sensitivity map includes a coil sensitivity map corresponding to each radio frequency receive coil unit, and the reconstruction module 220 can reconstruct the received image data (or magnetic resonance signal) of the radio frequency receive coil unit on the basis of the coil sensitivity map corresponding to each radio frequency receive coil unit so as to obtain the edge image of the implant.

The term "coil sensitivity" refers to the sensitivity of the radio frequency receive coil to the received magnetic resonance signal. The coil sensitivity map may be obtained by means of testing performed during the experimental phase, and may be stored in the magnetic resonance imaging system. The experimental phase includes phases such as a before-delivery phase, a system mounting phase, a maintenance service phase, etc.

In some embodiments, before reconstructing the original image data on the basis of the coil sensitivity map, the reconstruction module 220 further performs low-pass filtering on the data received by the plurality of radio frequency receive channels so as to perform smoothing and denoising. In some embodiments, a low-pass filter includes filters such as an SCIC filter, a homomorphic filter, an ITK-N4 offset field correction filter, etc.

In some embodiments, the control module 210 in the positioning device 200 may be the controller unit 120 or a part thereof in the magnetic resonance imaging system 100 shown in FIG. 1, and the reconstruction module 220 may be the data processing unit 130 or a part thereof in the magnetic resonance imaging system 100 shown in FIG. 1. In other embodiments, the magnetic resonance imaging system 100 includes a processor (not shown in the figure). The processor is integrated in the controller unit 120, and is configured to control the magnetic resonance imaging system to execute the first scanning sequence so as to obtain the original image data and to reconstruct the edge image of the implant on the basis of the original image data. That is, the control module 210 and the reconstruction module 220 may be integrated together.

In some embodiments, the positioning device 200 further includes a determination module 230. The determination module 230 is configured to determine, on the basis of a difference between one-dimensional signals or images obtained by a second scanning sequence and a third scanning sequence, whether a subject under examination comprises an implant, wherein a frequency-encoding direction of the second scanning sequence is different from a frequency-encoding direction of the third scanning sequence.

The term "one-dimensional signal" refers to a time-domain signal obtained by performing a Fourier transform on a row of or a column of data in the K space, and can also be understood as a projection of an amplitude signal of a two-dimensional image in one direction. The term "image" refers to a two-dimensional image obtained by performing a Fourier transform on data in the entire K space.

Figure 5:
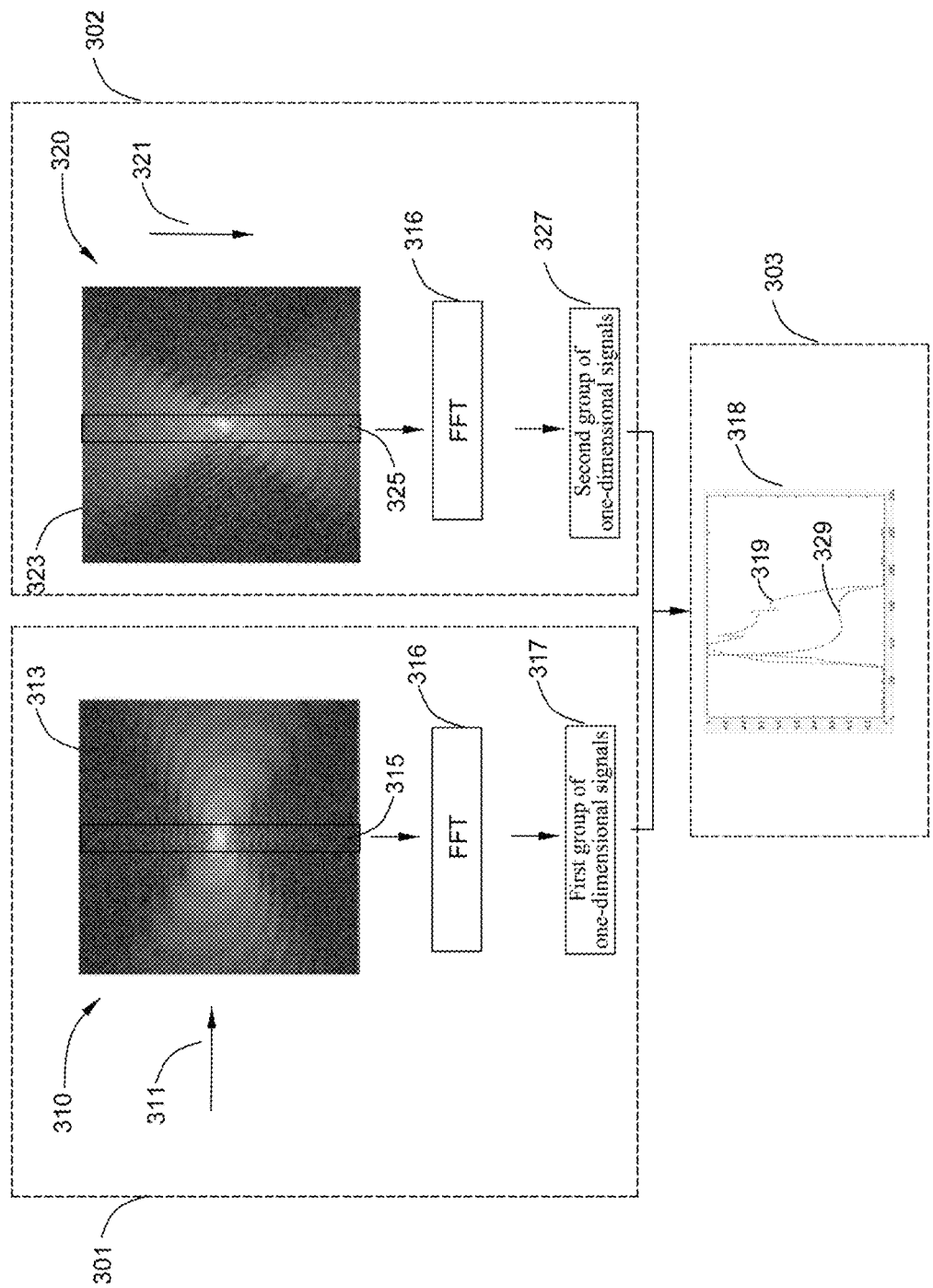
FIG. 5 is a key diagram of a determination module in a positioning device shown in FIG. 2.

Specifically, FIG. 5 shows a key diagram of the determination module in the positioning device shown in FIG. 2. As shown in FIG. 5, the determination module 230 further includes a first unit 301, a second unit 302, and a third unit 303.

In some embodiments, the first unit 301 is configured to execute the second scanning sequence 310 to obtain a first image or a first group of one-dimensional signals 317 of the subject under examination, and the second scanning sequence 310 includes a first frequency-encoding direction 311.

Specifically, firstly, the first unit 301 scans the subject under examination in the first frequency-encoding direction 311 and different phase gradients, and stores an obtained first group of image data 313 in the K space.

Next, a row of or a column of image data 315 corresponding to a specific frequency is selected from the K space. Specifically, the specific frequency is 0, and the row of or the column of image data 315 corresponding to the frequency of 0 is a row or a column in the K space perpendicular to the first frequency-encoding direction 311.

Finally, a Fourier transform 316 is performed on the row of or the column of image data 315 to obtain the first group of one-dimensional signals 317. Certainly, it is also possible to perform a Fourier transform on the first group of image data 313 in the entire K space to obtain the first image (not shown in the figure).

The second unit 302 is configured to execute the third scanning sequence 320 to obtain a second image or a second group of one-dimensional signals 327 of the subject under examination. The third scanning sequence 320 includes a second frequency-encoding direction 321. The second frequency-encoding direction 321 is perpendicular to the first frequency-encoding direction 311.

In some embodiments, firstly, the second unit 302 is configured to determine a specific phase, and the specific phase and the specific frequency correspond to the same row or the same column in the K space. Specifically, the specific phase and the specific frequency correspond to the same position in the K space.

Next, the second unit 302 is configured to scan the subject under examination in the second frequency-encoding direction 321 and the specific phase) to obtain image data of the same row or the same column as the second group of image data 325. Preferably, the specific phase is 0, corresponding to a frequency of 0 in the second scanning sequence. In addition, in the second unit 302, since the phase gradient is not changed, the obtained second group of image data 325 includes only a row or a column in the K space that is the same as the second frequency-encoding direction 321. Preferably, if the fixed phase gradient is 0, a row or a column that is the same as the second frequency-encoding direction 321 and located in the middle is filled in the K space.

Finally, a Fourier transform is performed on the second group of image data 325 to obtain the second group of one-dimensional signals 327.

In other embodiments, the second unit 302 is configured to scan the subject under examination in the second frequency-encoding direction 321 and different phase gradients, store obtained image data 323 in the K space, and perform a Fourier transform on the image data in the entire K space to obtain the second image (not shown in the figure). In still other embodiments, the second unit 302 is configured to scan the subject under examination in the second frequency-encoding direction 321 and different phase gradients, store the obtained image data 323 in the K space, and then select, from the K space, a row of or a column of data corresponding to a phase of 0 and perform a Fourier transform thereon so as to obtain the second group of one-dimensional signals.

During obtaining of the second group of one-dimensional signals, by selecting a fixed phase gradient (for example, a phase of 0), scanning can be performed only in the second frequency-encoding direction 321, thereby reducing scanning time required for determining whether an implanted device exists, reducing a specific absorption rate (SAR) value, and reducing risks to the subject under examination.

The term "specific absorption rate (SAR)" refers to power or energy absorbed by per unit of the human body, and is in unit of W/kg. SAR is a commonly used safety relevant parameter in a magnetic resonance imaging process.

The third unit 303 is configured to determine, on the basis of a difference between the first image and the second image or a difference between the first group of one-dimensional signals and the second group of one-dimensional signals, whether the subject under examination comprises an implant.

Specifically, after the first image and the second image are obtained, or after the first group of one-dimensional signals 317 and the second group of one-dimensional signals 327 are obtained, the third unit 303 can determine, according to a difference between the first image and the second image or a difference between the first group of one-dimensional signals 317 and the second group of one-dimensional signals 327, whether the subject under examination comprises an implant. In some embodiments, if the difference between the first image and the second image exceeds a preset threshold, it is determined that the subject under examination comprises an implant. In some embodiments, if the difference between the first group of one-dimensional signals 317 and the second group of one-dimensional signals 327 exceeds a preset threshold, it is determined that the subject under examination comprises an implant.

Graph 318 represents variation trends of signal amplitudes of the first group of one-dimensional signals and the second group of one-dimensional signals over time; curve 319 corresponds to the first group of one-dimensional signals 317; curve 329 corresponds to the second group of one-dimensional signals; it can be learned that if an implant exists in the subject under examination, a variation trend of a magnetic resonance signal in an amplitude 319 of the first group of one-dimensional signals over time and a variation trend of a magnetic resonance signal in an amplitude 329 of the second group of one-dimensional signals over time are quite different from each other. That is, if an implant exists, the first group of one-dimensional signals 317 and the second group of one-dimensional signals 327 are quite different from each other. Therefore, by the difference between the images obtained by using two scanning sequences having different frequency-encoding directions, it can be easily determined whether an implant exists in the subject under examination. The signal amplitude refers to a projection of a signal amplitude of the two-dimensional image on one dimension.

Although it is pointed out in some embodiments of the present invention that it is possible to determine, on the basis of the difference between the images obtained by using two scanning sequences having different frequency-encoding directions, whether the subject under examination comprises an implant, it will be appreciated by those skilled in the art that determining whether an implanted device exists is not limited to the manner described above, and can be based on any other suitable method; for example, the two groups of images can be obtained by changing imaging parameters (for example, echo time TE), and a difference image is calculated to determine whether an implanted device exists.

Please continue to refer to FIG. 2, the positioning device 200 further includes an indication module 240, and the indication module 240 is configured to, after completion of imaging scanning, indicate predicted values of magnetic resonance imaging system parameters relevant to the implant and a safety status of one or a plurality of the parameters.

Specifically, during imaging scanning, after the first scanning sequence is executed to determine the position information of the implant, the indication module 240 can predict and indicate values of magnetic resonance imaging system parameters relevant to the implant and safety statuses according to the parameters and the position information of the implant, and provide references or suggestions for subsequent formal scanning. The parameters of the implant include the size, the material, or the type of the implant, and the magnetic resonance imaging system parameters relevant to the implant include one or a plurality of a gradient magnetic field intensity, a radio frequency magnetic field intensity, a main magnetic field spatial gradient intensity, a temperature, and an absorption rate.

For the safety status of one or a plurality of the parameters, different types (e.g., color, text, graphics, or sound) may be adopted to indicate different safety statuses (e.g., safe, relatively dangerous, dangerous, etc., or high risk, medium risk, low risk, etc.). In some embodiments, when values of the parameters exceed preset thresholds thereof, a corresponding warning is issued. Further, if the values of the parameters exceed preset thresholds thereof, a warning is issued by changing the safety status of the parameters. An example includes, but is not limited to, changing the safety status of the radio frequency field intensity from green to orange or from orange to red to issue a warning if the value of the radio frequency field intensity in the parameters exceeds a preset threshold. It will be appreciated by those skilled in the art that change in the safety status of the parameters is not limited to the manner described above.

Figure 6:
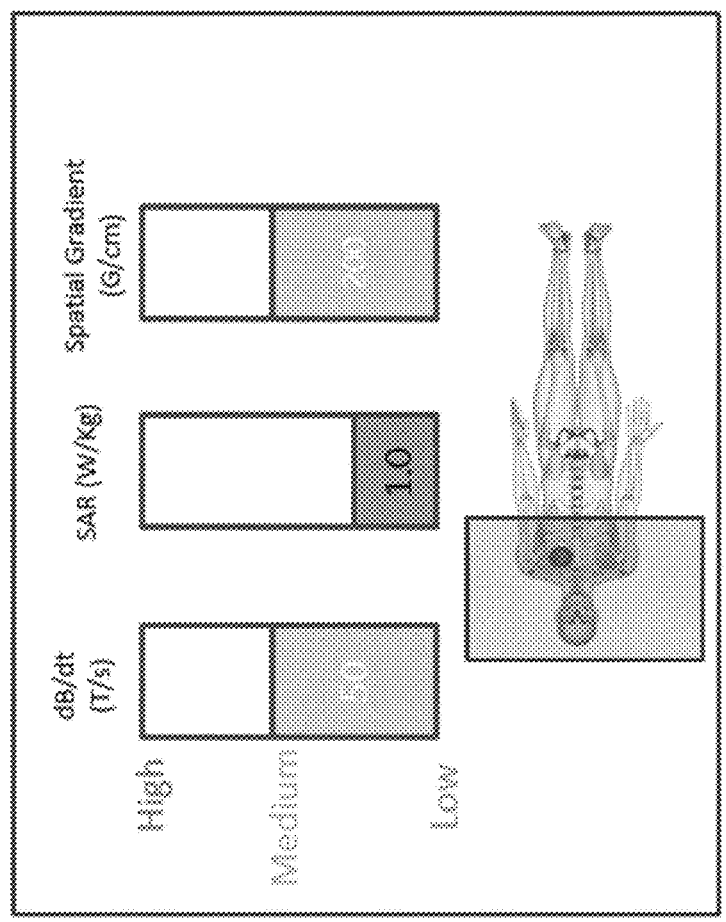
FIG. 6 is a schematic diagram of a user interface for scanning risk indication according to some embodiments of the present invention.
Figure 7:
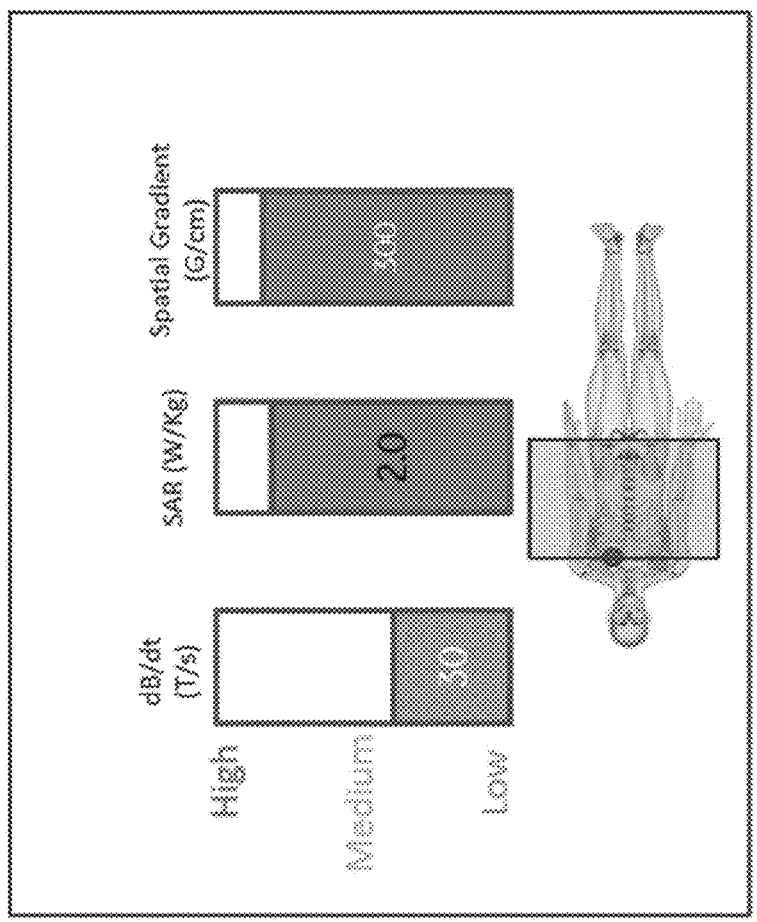
FIG. 7 is a schematic diagram of a user interface for scanning risk indication according to other embodiments of the present invention.

FIG. 6 shows a schematic diagram of a user interface for scanning risk indication according to some embodiments of the present invention, and FIG. 7 shows a schematic diagram of a user interface for scanning risk indication according to other embodiments of the present invention. As shown in FIGS. 6-7, for implants having the same parameters and in the same position, FIGS. 6 and 7 respectively show indications of predicted scanning risks respectively corresponding to a case in which the head serves as a scanned position and a case in which the abdomen serves as the scanned position. FIG. 6 shows a scanning risk user interface corresponding to head scanning, and FIG. 7 shows a scanning risk user interface corresponding to the abdomen. The magnetic resonance imaging system parameters relevant to the implant in the scanning risk include the gradient magnetic field intensity (dB/dt), the absorption rate (SAR), and the main magnetic field spatial gradient intensity (B0+), and a warning is issued by changing the color of the safety status to notify the user or the operator that a certain parameter has a high risk or a medium risk.

By comparing FIG. 6 with FIG. 7, it can be learned that for the same implant parameter and the same position, different formal scanned positions correspond to different risks to the subject under examination. For example, for a subject under examination equipped with a pacemaker, the risk of scanning the abdomen is relatively high, and in particular, the SAR value and a spatial gradient value are high. During formal scanning, the user or the operator can change certain scanning parameters to avoid harm to the subject under examination.

Although FIGS. 6-7 show a user interface for indicating a scanning risk, it will be appreciated by those skilled in the art that the user interface is not limited to the display manner of histogram described above, and may involve any form that can display the status of a real-time parameter. For example, each parameter can be represented in the form of a pointer. In addition, although the figures show that a warning is issued by changing the color if a certain parameter exceeds a preset threshold thereof, the warning may be issued by, not limited to the manner, making a sound, or by the combination of changing the status and making a sound. Moreover, the user interface is not limited to displaying only the contents in FIGS. 6-7, but may also include any other relevant information or functions.

Figure 8:
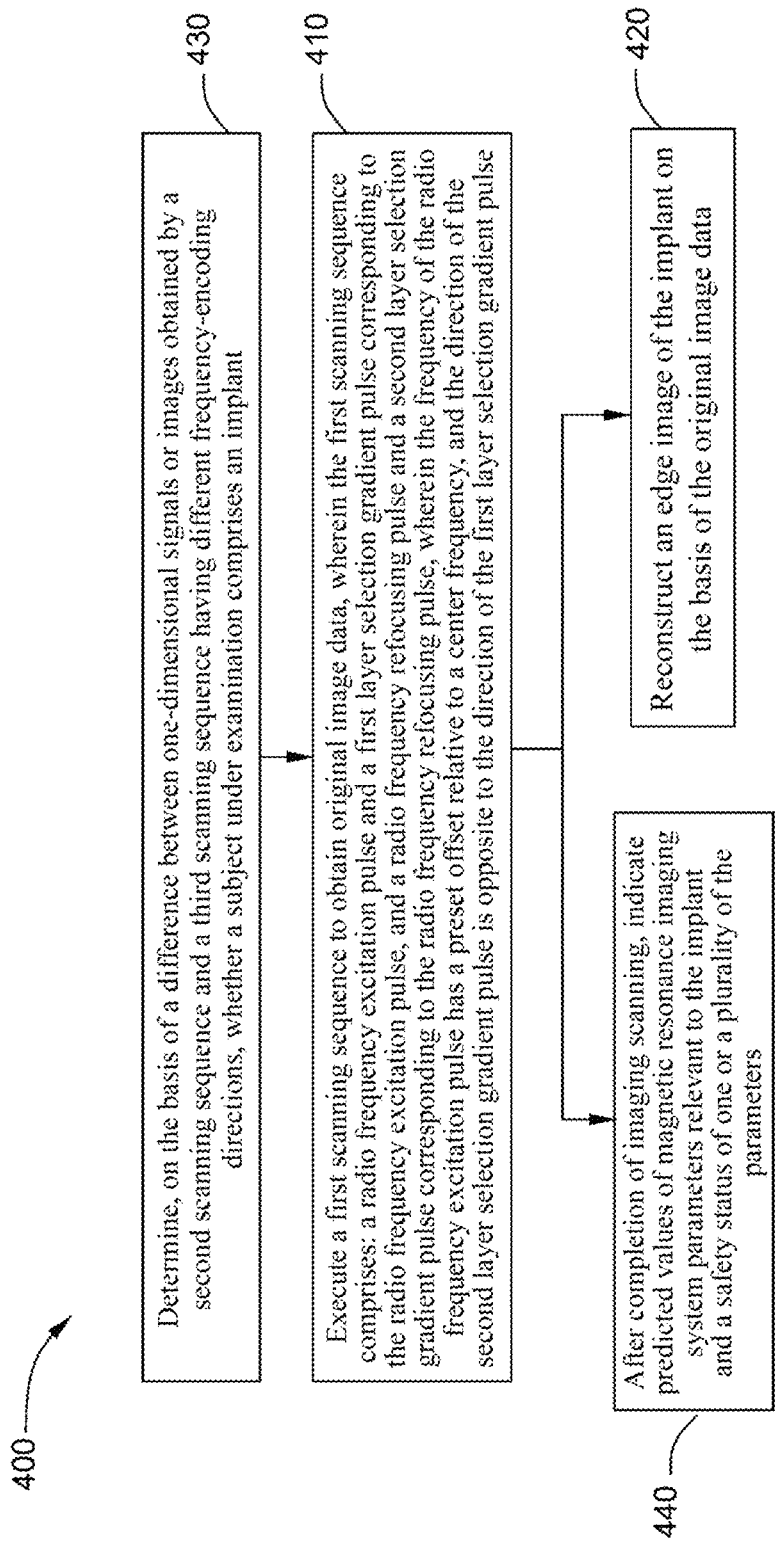
FIG. 8 is a flowchart of a positioning method of an implant for a magnetic resonance imaging system according to some embodiments of the present invention.

FIG. 8 shows a specific flowchart of a positioning method 400 of the implant for the magnetic resonance imaging system according to some embodiments of the present invention. As shown in FIG. 8, the positioning method 400 of the implant includes step 410 and step 420.

In step 410, a first scanning sequence is executed to obtain original image data, wherein the first scanning sequence comprises: a radio frequency excitation pulse and a first layer selection gradient pulse corresponding to the radio frequency excitation pulse, and a radio frequency refocusing pulse and a second layer selection gradient pulse corresponding to the radio frequency refocusing pulse, wherein the frequency of the radio frequency excitation pulse has a preset offset relative to a center frequency, and the direction of the second layer selection gradient pulse is opposite to the direction of the first layer selection gradient pulse.

Specifically, the radio frequency excitation pulse is configured to excite marginal tissue of the implant. More specifically, the radio frequency excitation pulse comprising the preset offset is configured to excite the marginal tissue of the implant.

Specifically, the preset offset is determined on the basis of relevant parameters of the implant. Specifically, the relevant parameters of the implant include at least one of a material, a size, or a type of the implant. In some embodiments, the preset offset may be obtained on the basis of a lookup table (LUT). The lookup table includes the relevant parameters of the implant and the preset offset relative to the center frequency corresponding thereto. The frequency offset may be obtained on the basis of a phantom in an experimental phase, and may be stored in the magnetic resonance imaging system.

Specifically, the reconstructing an edge image of the implant comprises reconstructing the original image data on the basis of a coil sensitivity map, wherein the original image data comprises data received by a plurality of radio frequency receive channels.

In step 420, an edge image of the implant is reconstructed on the basis of the original image data.

Specifically, if the radio frequency receive coil has a single channel, reconstruction can be performed on the basis of data received and transmitted by the single channel to obtain the edge image of the implant. If the radio frequency receive coil has a plurality of channels, the original image data can be reconstructed on the basis of the coil sensitivity map, wherein the original image data includes data received by the plurality of radio frequency receive channels. In some embodiments, before reconstructing the original image data on the basis of the coil sensitivity map, low-pass filtering is further performed on the data received by the plurality of radio frequency receive channels so as to perform smoothing and denoising.

In some embodiments, the positioning method 400 of the implant further includes step 430.

In step 430, it is determined, on the basis of a difference between one-dimensional signals or images obtained by a second scanning sequence and a third scanning sequence having different frequency-encoding directions, whether the subject under examination comprises an implant. A specific method of determining whether the subject under examination comprises an implant will be described later in conjunction with FIG. 9.

In some embodiments, the positioning method 400 of the implant includes step 440.

In step 440, during imaging scanning, after completion of the imaging scanning, predicted values of magnetic resonance imaging system parameters relevant to the implant and a safety status of one or a plurality of the parameters are indicated.

Specifically, the magnetic resonance imaging system parameters relevant to the implant include one or a plurality of a gradient magnetic field intensity, a radio frequency magnetic field intensity, a main magnetic field spatial gradient intensity, a temperature, and an absorption rate, and by changing an indication status (e.g., color, text, graphics, or sound) corresponding to the parameter, the safety status (e.g., safe, relatively dangerous, dangerous, etc.) of the parameter can be indicated in real time so as to notify the operator to adjust or select a relatively safe parameter configuration or scanning sequence during formal scanning.

Figure 9:
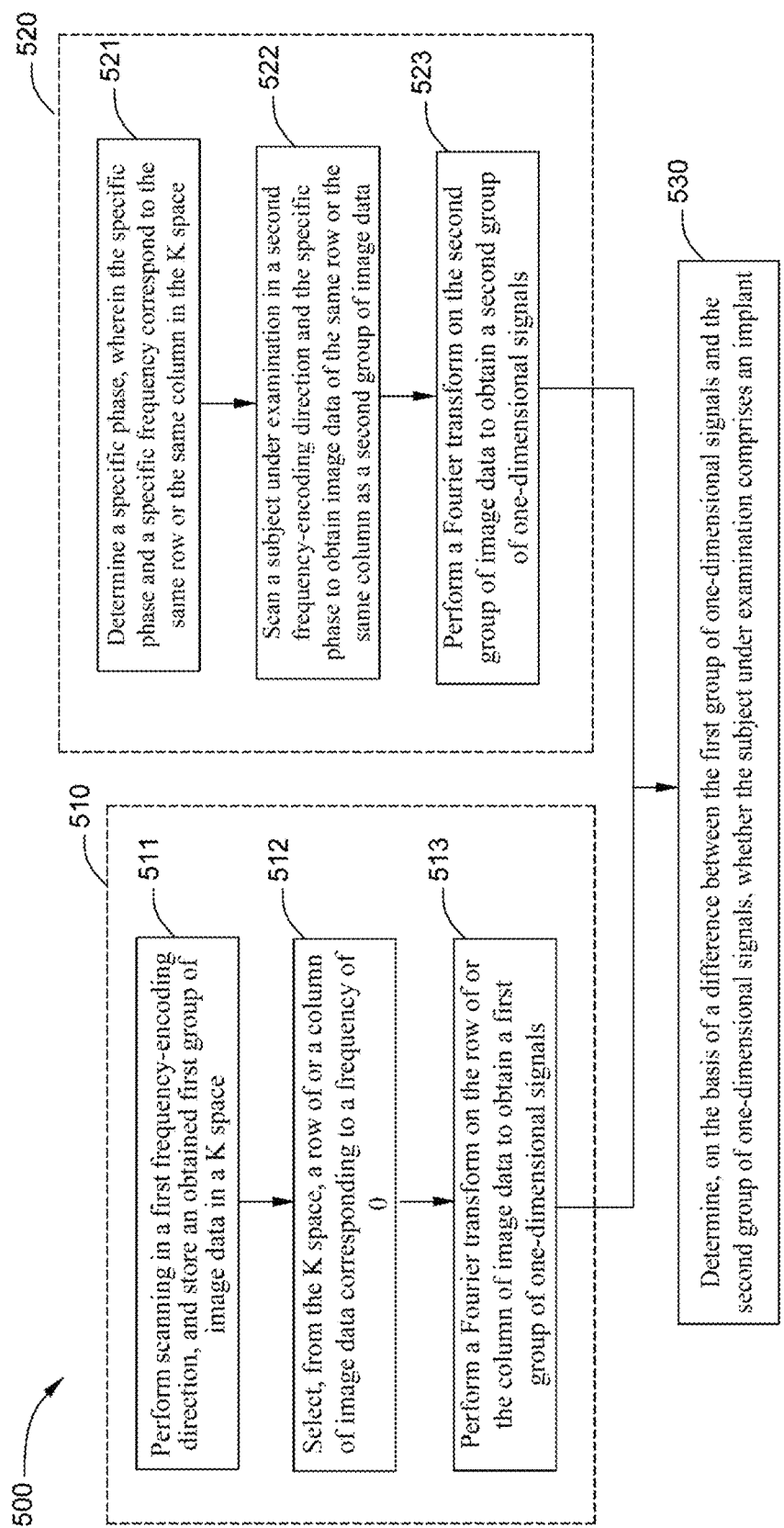
FIG. 9 is a flowchart of determining whether a subject under examination comprises an implant according to some embodiments of the positioning method in FIG. 8.

FIG. 9 shows a flowchart of determining whether a subject under examination comprises an implant 500 according to some embodiments of the positioning method in FIG. 8. As shown in FIG. 9, determining whether a subject under examination comprises an implant 500 includes step 510, step 520, and step 530.

In step 510, the second scanning sequence is executed to obtain a first group of one-dimensional signals of the subject under examination, and the second scanning sequence includes a first frequency-encoding direction.

Specifically, step 510 includes step 511, step 512, and step 513.

In step 511, the subject under examination is scanned in the first frequency-encoding direction, and an obtained first group of image data is stored in a K space. Specifically, the second scanning sequence includes different phase encoding gradients for scanning, and magnetic resonance signals corresponding to the same frequency encoding and different phase encoding are filled in a row or a column perpendicular to the first frequency-encoding direction in the K space. In the K space, a phase encoding corresponding to a center position is 0 and the signal strength is the largest, and a phase gradient corresponding to a peripheral position is the largest and the spatial information is the most plentiful.

In step 512, a row of or a column of image data corresponding to a specific frequency is selected from the K space. Specifically, the specific frequency may be 0. In the first frequency-encoding direction, the frequency of data corresponding to a row or a column and perpendicular to the first frequency-encoding direction and in the center of the K space is 0.

In step 513, a Fourier transform is performed on the row of or the column of image data to obtain the first group of one-dimensional signals. Specifically, the first group of one-dimensional signals can be obtained by performing a Fourier transform or an inverse Fourier transform on the row of or the column of image data in the K space and having a frequency of 0.

In step 520, the third scanning sequence is executed to obtain a second group of one-dimensional signals of the subject under examination. The third scanning sequence includes a second frequency-encoding direction, and the second frequency-encoding direction is perpendicular to the first frequency-encoding direction.

In some embodiments, step 520 includes step 521, step 522, and step 523.

In step 521, a specific phase is determined. The specific phase and the specific frequency correspond to the same row or the same column in the K space.

In step 522, the subject under examination is scanned in the second frequency-encoding direction and the specific phase to obtain image data in the same row or the same column as a second group of image data. Specifically, in the third scanning direction, a fixed phase gradient is used to scan the subject under examination in the second frequency-encoding direction. The data or the magnetic resonance signal can be filled in the same row or the same column in the K space that is the same as the second frequency-encoding direction. Preferably, the fixed phase is 0 and in this case, the signal strength is the largest, and the acquired data is filled in a row or a column in the center of the K space. In the third scanning sequence, only a fixed phase gradient is needed to perform encoding in the frequency direction, thereby resulting in reduced scanning time, a lower SAR value, and a higher safety for the subject under examination.

In step 523, a Fourier transform is performed on the second group of image data to obtain the second group of one-dimensional signals.

In step 530, it is determined, on the basis of a difference between the first group of one-dimensional signals and the second group of one-dimensional signals, whether the subject under examination comprises an implant.

Specifically, if the difference between the first group of one-dimensional signals and the second group of one-dimensional signals exceeds a preset threshold, it is determined that the subject under examination comprises an implant.

Figure 10:
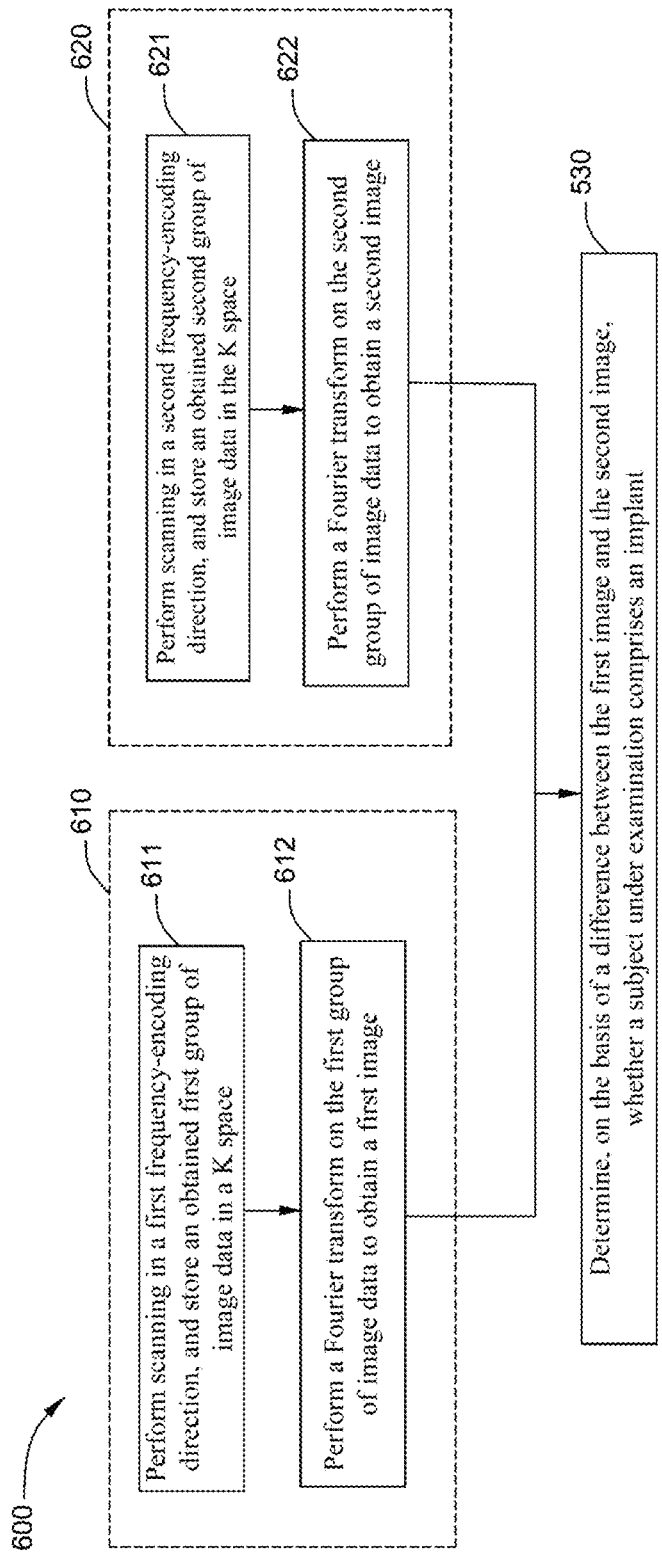
FIG. 10 is a flowchart of determining whether a subject under examination comprises an implant according to other embodiments of the positioning method in FIG. 8.

FIG. 10 shows a flowchart of determining whether a subject under examination comprises an implant 600 according to other embodiments of the positioning method in FIG. 8. As shown in FIG. 10, the method 600 of determining whether a subject under examination comprises an implant differs from the method 500 of determining whether a subject under examination comprises an implant in that: step 610 is configured to execute the second scanning sequence to obtain the first image of the subject under examination, step 620 is configured to execute the third scanning sequence to obtain the second image of the subject under examination, and step 630 is configured to determine, on the basis of the difference between the first image and the second image, whether the subject under examination comprises an implant.

Specifically, step 610 includes step 611 and step 612.

In step 611, the subject under examination is scanned in the first frequency-encoding direction, and an obtained first group of image data is stored in a K space.

In step 612, a Fourier transform is performed on the first group of image data to obtain the first image.

Specifically, step 620 includes step 621 and step 622.

In step 621, the subject under examination is scanned in the second frequency-encoding direction, and an obtained second group of image data is stored in the K space. Specifically, in the third scanning direction, the phase gradient also changes.

In step 622, a Fourier transform is performed on the second group of image data to obtain the second image.

Figure 11:
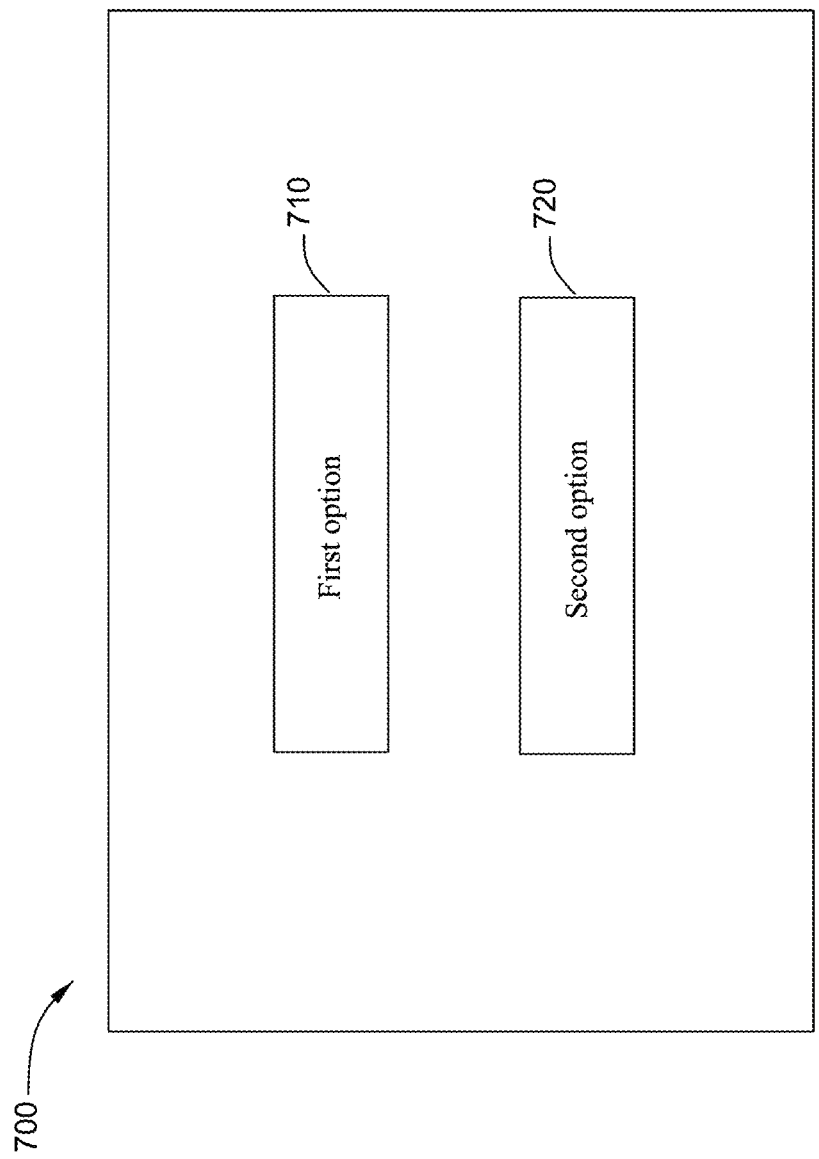
FIG. 11 is an image display interface according to some embodiments of the present invention.

FIG. 11 shows an image display interface according to some embodiments of the present invention. As shown in FIG. 11, a display unit of the magnetic resonance imaging system includes: an image display interface 700 including a first option 710 related to detection by determination of the position of an implant; and a second option 720 related to detection of existence of an implant. The first option 710 includes a first scanning sequence, and the magnetic resonance imaging system can perform step 410 and step 420 to obtain the edge image of the implant so as to obtain an accurate position of the implant. The second option 720 includes a second scanning sequence and a third scanning sequence, and the magnetic resonance imaging system can execute step 510, step 520, and step 530 to determine, on the basis of the difference between the two images or one-dimensional signals obtained by the second scanning sequence and the third scanning sequence, whether an implant exists in the subject under examination.

The aforementioned "detection of existence of an implant" and "detection by determination of the position of an implant" are merely illustrative, and those skilled in the art could set any option name that can be determined by the operator.

In summary, in the positioning method of an implant for a magnetic resonance imaging system according to some embodiments of the present invention, by configuring the frequency of the radio frequency excitation pulse to include a preset offset relative to the center frequency, the marginal tissue of the implant can be effectively excited to determine the accurate position of the implant; by reversing the direction of the second layer selection gradient pulse corresponding to the radio frequency refocusing pulse, metal artifacts and distortion can be reduced, and the marginal tissue image of the implant can be obtained more effectively; by reconstructing the original image data on the basis of the coil sensitivity map, loss of phase information during reconstruction of magnetic resonance signals of a plurality of radio frequency receive channels can be avoided, and more accurate position information of the implant can be obtained; during determination on whether an implant exists in the subject under examination, by comparing the images or the one-dimensional signals obtained by means of two scans, it can be easily determined whether an implant exists in the subject under examination; in addition, in the latter scan (corresponding to the third scanning sequence), the phase encoding gradient does not need to be changed, and scanning only needs to be performed in the frequency-encoding direction to obtain only a row of or a column of data in the K space, thereby reducing scanning time, reducing the SAR value, and reducing risks to the subject under examination.

The present invention may further provide a non-transitory computer-readable storage medium, for storing an instruction set and/or a computer program. When executed by a computer, the instruction set and/or computer program causes the computer to perform the aforementioned method for obtaining a predicted image of a truncated portion. The computer executing the instruction set and/or computer program may be a computer of an MRI system, or may be other devices/modules of the MRI system. In one embodiment, the instruction set and/or computer program may be programmed in a processor/controller of the computer.

Specifically, when executed by the computer, the instruction set and/or computer program causes the computer to:

execute a first scanning sequence to obtain original image data, wherein the first scanning sequence includes: a radio frequency excitation pulse and a first layer selection gradient pulse corresponding to the radio frequency excitation pulse, the frequency of the radio frequency excitation pulse having a preset offset relative to a center frequency; and a radio frequency refocusing pulse and a second layer selection gradient pulse corresponding to the radio frequency refocusing pulse, the direction of the second layer selection gradient pulse being opposite to the direction of the first layer selection gradient pulse; and reconstruct an edge image of the implant on the basis of the original image data.

The instructions described above may be combined into one instruction for execution, and any of the instructions may also be split into a plurality of instructions for execution. Moreover, the present invention is not limited to the instruction execution order described above.

As used herein, the term "computer" may include any processor-based or microprocessor-based system including a system that uses a microcontroller, a reduced instruction set computer (RISC), an application specific integrated circuit (ASIC), a logic circuit, and any other circuit or processor capable of executing the functions described herein. The above examples are merely exemplary and thus are not intended to limit the definition and/or meaning of the term "computer" in any manner.

The instruction set may include various commands that instruct a computer acting as a processor or instruct a processor to perform particular operations, such as the methods and processes of various embodiments. The instruction set may be in the form of a software program, and the software program can form part of one or a plurality of tangible, non-transitory computer-readable media. The software may be in various forms such as system software or application software. In addition, the software may be in the form of a set of independent programs or modules, a program module within a larger program, or part of a program module. The software may also include modular programming in the form of object-oriented programming. The input data may be processed by the processor in response to an operator command, or in response to a previous processing result, or in response to a request made by another processor.

Some exemplary embodiments have been described above; however, it should be understood that various modifications may be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementations also fall within the protection scope of the claims.

The invention claimed is:

1. A positioning method of an implant for a magnetic resonance imaging system, comprising:
   executing a first scanning sequence to obtain original image data; and
   reconstructing an edge image of the implant on the basis of the original image data;
   wherein the first scanning sequence comprises:
   a radio frequency excitation pulse and a first layer selection gradient pulse corresponding to the radio frequency excitation pulse, the frequency of the radio frequency excitation pulse having a preset offset relative to a center frequency;
   a radio frequency refocusing pulse and a second layer selection gradient pulse corresponding to the radio frequency refocusing pulse, the direction of the second layer selection gradient pulse being opposite to the direction of the first layer selection gradient pulse;
   wherein the reconstructing an edge image of the implant comprises:
   reconstructing the original image data on the basis of a coil sensitivity map, wherein the original image data comprises data received by a plurality of radio frequency receive channels; and
   wherein the positioning method further comprise after completion of imaging scanning, indicating predicted values of magnetic resonance imaging system parameters relevant to the implant and a safety status of one or a plurality of the parameters.

2. The positioning method according to claim 1, wherein the radio frequency excitation pulse is configured to excite marginal tissue of the implant.

3. The positioning method according to claim 1, wherein the preset offset is determined on the basis of relevant parameters of the implant.

4. The positioning method according to claim 1, further comprising:
   determining, on the basis of a difference between one-dimensional signals or images obtained by a second scanning sequence and a third scanning sequence, whether a subject under examination comprises an implant, wherein a frequency-encoding direction of the second scanning sequence is different from a frequency-encoding direction of the third scanning sequence.

5. The positioning method according to claim 4, wherein the determining whether a subject under examination comprises an implant comprises:
   executing the second scanning sequence to obtain a first image or a first group of one-dimensional signals of the subject under examination, the second scanning sequence comprising a first frequency-encoding direction;
   executing the third scanning sequence to obtain a second image or a second group of one-dimensional signals of the subject under examination, the third scanning sequence comprising a second frequency-encoding direction, and the second frequency-encoding direction being perpendicular to the first frequency-encoding direction; and
   determining, on the basis of a difference between the first image and the second image or a difference between the first group of one-dimensional signals and the second group of one-dimensional signals, whether the subject under examination comprises an implant.

6. The positioning method according to claim 5, wherein the obtaining a first group of one-dimensional signals of the subject under examination comprises:
scanning the subject under examination in the first frequency-encoding direction, and storing an obtained first group of image data in a K space;
selecting, from the K space, a row of or a column of image data corresponding to a specific frequency; and
performing a Fourier transform on the row of or the column of image data to obtain the first group of one-dimensional signals.

7. The positioning method according to claim 6, wherein the obtaining a second group of one-dimensional signals of the subject under examination comprises:
determining a specific phase, the specific phase and the specific frequency corresponding to the same row or the same column in the K space;
scanning the subject under examination in the second frequency-encoding direction and the specific phase to obtain image data of the same row or the same column as a second group of image data; and
performing a Fourier transform on the second image data to obtain the second group of one-dimensional signals.

8. The positioning method according to claim 5, wherein the determining, on the basis of a difference between the first image and the second image or a difference between the first group of one-dimensional signals and the second group of one-dimensional signals, whether the subject under examination comprises an implant comprises:
if the difference between the first image and the second image exceeds a preset threshold, or if the difference between the first group of one-dimensional signals and the second group of one-dimensional signals exceeds a preset threshold, determining that the subject under examination comprises an implant.

9. A non-transitory computer-readable storage medium for storing a computer program, wherein when executed by a computer, the computer program causes the computer to perform a positioning method, the positioning method comprising the steps of:
executing a first scanning sequence to obtain original image data;
reconstructing an edge image of the implant on the basis of the original image data;
wherein the first scanning sequence comprises:
a radio frequency excitation pulse and a first layer selection gradient pulse corresponding to the radio frequency excitation pulse, the frequency of the radio frequency excitation pulse having a preset offset relative to a center frequency; and
a radio frequency refocusing pulse and a second layer selection gradient pulse corresponding to the radio frequency refocusing pulse, the direction of the second layer selection gradient pulse being opposite to the direction of the first layer selection gradient pulse;
wherein the reconstructing an edge image of the implant comprises:
reconstructing the original image data on the basis of a coil sensitivity map, wherein the original image data comprises data received by a plurality of radio frequency receive channels; and
wherein the positioning method further comprises the step of after completion of imaging scanning, indicating predicted values of magnetic resonance imaging system parameters relevant to the implant and a safety status of one or a plurality of the parameters.

10. A magnetic resonance imaging system, comprising a positioning device of an implant, and the positioning device comprising:
a control module, configured to execute a first scanning sequence to obtain original image data, wherein the first scanning sequence comprises:
a radio frequency excitation pulse and a first layer selection gradient pulse corresponding to the radio frequency excitation pulse, the frequency of the radio frequency excitation pulse having a preset offset relative to a center frequency; and
a radio frequency refocusing pulse and a second layer selection gradient pulse corresponding to the radio frequency refocusing pulse, the direction of the second layer selection gradient pulse being opposite to the direction of the first layer selection gradient pulse;
a reconstruction module, configured to reconstruct an edge image of the implant on the basis of the original image data;
wherein the reconstruction module is further configured to reconstruct the original image data on the basis of a coil sensitivity map, wherein the original image data comprises data received by a plurality of radio frequency receive channels; and
wherein the positioning device further comprises an indication module, configured to, after completion of imaging scanning, indicate predicted values of magnetic resonance imaging system parameters relevant to the implant and a safety status of one or a plurality of the parameters.

11. The positioning device according to claim 10, wherein the radio frequency excitation pulse is configured to excite marginal tissue of the implant.

12. The positioning device according to claim 10, wherein the preset offset is determined on the basis of relevant parameters of the implant.

13. The positioning device according to claim 10, further comprising:
a determination module, configured to determine, on the basis of a difference between one-dimensional signals or images obtained by a second scanning sequence and a third scanning sequence, whether a subject under examination comprises an implant, wherein a frequency-encoding direction of the second scanning sequence is different from a frequency-encoding direction of the third scanning sequence.

14. The positioning device according to claim 13, wherein the determination module comprises:
a first unit, configured to execute the second scanning sequence to obtain a first image or a first group of one-dimensional signals of the subject under examination, the second scanning sequence comprising a first frequency-encoding direction;
a second unit, configured to execute the third scanning sequence to obtain a second image or a second group of one-dimensional signals of the subject under examination, the third scanning sequence comprising a second frequency-encoding direction, and the second frequency-encoding direction being perpendicular to the first frequency-encoding direction; and
a third unit, configured to determine, on the basis of a difference between the first image and the second image or a difference between the first group of one-dimensional signals and the second group of one-dimensional signals, whether the subject under examination comprises an implant.

15. A positioning method of an implant for a magnetic resonance imaging system, comprising:
   executing a first scanning sequence to obtain original image data; and
   reconstructing an edge image of the implant on the basis of the original image data;
   wherein the first scanning sequence comprises:
   a radio frequency excitation pulse and a first layer selection gradient pulse corresponding to the radio frequency excitation pulse, the frequency of the radio frequency excitation pulse having a preset offset relative to a center frequency;
   a radio frequency refocusing pulse and a second layer selection gradient pulse corresponding to the radio frequency refocusing pulse, the direction of the second layer selection gradient pulse being opposite to the direction of the first layer selection gradient pulse;
   wherein the positioning method further comprises:
      after completion of imaging scanning, indicating predicted values of magnetic resonance imaging system parameters relevant to the implant and a safety status of one or a plurality of the parameters.

* * * * *